United States Patent
Park et al.

(10) Patent No.: US 6,627,514 B1
(45) Date of Patent: Sep. 30, 2003

(54) SEMICONDUCTOR DEVICE HAVING A Y-SHAPED ISOLATION LAYER AND SIMPLIFIED METHOD FOR MANUFACTURING THE Y-SHAPED ISOLATION LAYER TO PREVENT DIVOT FORMATION

(75) Inventors: Tai-su Park, Suwon (KR); Kyung-won Park, Suwon (KR); Sung-jin Kim, Yongin (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/710,225

(22) Filed: Nov. 10, 2000

(30) Foreign Application Priority Data

Nov. 12, 1999 (KR) .......................................... 1999-50224

(51) Int. Cl.[7] .............................................. H01L 21/76
(52) U.S. Cl. ...................................................... 438/435
(58) Field of Search ................................. 438/424, 433, 438/435; 257/510

(56) References Cited

U.S. PATENT DOCUMENTS

| | | | | |
|---|---|---|---|---|
| 4,352,724 | A | * 10/1982 | Sugishima et al. | 204/192 E |
| 5,389,352 | A | * 2/1995 | Wang | 423/263 |
| 5,933,749 | A | * 8/1999 | Lee | 438/435 |
| 5,968,610 | A | * 10/1999 | Liu et al. | 427/579 |
| 6,033,968 | A | * 3/2000 | Song | 438/424 |
| 6,140,208 | A | * 10/2000 | Agahi et al. | 438/437 |
| 6,187,651 | B1 | * 2/2001 | Oh | 438/435 |
| 6,203,863 | B1 | * 3/2001 | Liu et al. | 427/579 |
| 6,245,641 | B1 | * 6/2001 | Shiozawa et al. | 438/427 |

FOREIGN PATENT DOCUMENTS

| | | | |
|---|---|---|---|
| EP | 000773582 A2 | * 5/1997 | H01L/21/762 |
| JP | 2001-196450 | * 7/2001 | H01L/21/76 |
| KR | 99-65028 | 8/2001 | |

OTHER PUBLICATIONS

Translation of Korean Patent Abstracts and Notice to Submit Response.

* cited by examiner

Primary Examiner—Chandra Chaudhari
Assistant Examiner—David S Blum
(74) Attorney, Agent, or Firm—Marger Johnson & McCollom, P.C.

(57) ABSTRACT

A semiconductor device having a Y-shaped isolation layer and a method for manufacturing the same are provided. The semiconductor device includes a Y-shaped isolation layer, which comprises side walls characterized by first and second slopes on the sides of the isolation layer. The method for manufacturing the isolation layer includes the step of forming a trench in a semiconductor substrate using a photoresist pattern as an etching mask. Next, a thermal oxide film is formed on the surface of the semiconductor substrate, and then a thin nitride liner is formed on the thermal oxide film. The nitride liner prevents oxidation of the side wall of the trench and also acts as a planarization stop layer. Thereafter, a gap-filling isolation layer is formed to fill the trench such that the nitride liner is separated or thinner at the upper corners of the trench. Next, the gap-filling isolation layer is planarized using the nitride liner as a planarization stop layer. The nitride liner used as the planarization stop layer is removed. According to the present invention, formation of a divot at the boundary between an isolation region and an active region can be prevented.

17 Claims, 7 Drawing Sheets

US 6,627,514 B1

SEMICONDUCTOR DEVICE HAVING A Y-SHAPED ISOLATION LAYER AND SIMPLIFIED METHOD FOR MANUFACTURING THE Y-SHAPED ISOLATION LAYER TO PREVENT DIVOT FORMATION

BACKGROUND OF THE INVENTION

1. Field of the Invention

The present invention relates to a semiconductor device and a manufacturing method thereof, and more particularly, to an isolation layer in the semiconductor device.

2. Description of the Related Art

Trench isolation methods are widely used in the manufacture of semiconductor integrated circuit devices because they ensure a narrow isolation distance and reduce the surface topology of a semiconductor substrate having an isolation layer. Particularly, the trench isolation methods prevent a punch-through phenomenon and reduce the thickness of an isolation layer, which are the problems of local oxidation of silicon (LOCOS) method, as the density of a semiconductor device increases. However, compared to the LOCOS method, the trench isolation methods are very complex.

In a typical trench isolation method, a trench is formed in a predetermined portion of a semiconductor substrate, and the trench is filled with a gap-filling insulating layer. Since the trench is formed by a dry etch method, e.g., a reactive ion etching (RIE) method, the inner wall of the trench can be damaged. Accordingly, a thermal oxide film is formed on the inner wall of the trench to prevent it from being damaged. In addition, to prevent the inner wall of the trench from being oxidized, a nitride liner, which is excellent for blocking the diffusion of oxygen, may be additionally formed on the thermal oxide layer, before filling the trench with a gap-filling isolation layer. However, when a nitride liner is formed, it tends to recess into the isolation layer when a pad nitride layer (used as an etching mask for forming an isolation trench) is removed, thereby causing a problem in subsequent process steps.

Referring to FIG. 1A, in a conventional trench isolation method, a mask pattern M including a pad oxide layer 102 and a pad nitride layer 104 is formed on a semiconductor substrate 100. Next, the semiconductor substrate 100 is etched to a predetermined depth using the mask pattern M as an etching mask, thereby forming a trench T. Thereafter, to repair damage to the inner wall of the trench T, a thermal oxide film 106 is formed on the inner wall of the trench T. Subsequently, to prevent oxidation of the inner wall of the trench T due to oxygen diffusion, a nitride liner 108 is formed on the thermal oxide film 106. Next, a gap-filling isolation (insulating) layer 110 is formed on the entire surface of the semiconductor substrate 100, and then the gap-filling isolation layer 110 is planarized to substantially the same level as the nitride liner 108 formed on the mask pattern M.

Referring to FIG. 1B, a wet etch process using phosphoric acid as an etchant is performed to remove the pad nitride layer 104 and the nitride liner 108 formed on the outside of the trench T. Unfortunately, the pad nitride layer 104 is overetched for it to be completely removed, the nitride liner 108 formed in the trench T is also etched. As a result, an undesirable divot 112 is produced in the trench T, and thus the nitride liner 108 is recessed from the top surface of the semiconductor substrate 100 by a distance D. Such recessed nitride liner 108 causes many problems in subsequent process steps as described below.

Referring to FIG. 1C, the resulting structure is planarized by a chemical mechanical polishing (CMP) method such that the level of the top surface of the gap-filling isolation layer 110 is substantially equal to the level of the top surface of the semiconductor substrate 100. As a result, an isolation layer 110' is formed in the trench T. Next, the pad oxide layer 102 (of FIG. 1B) is removed using a HF solution. During the removal of the pad oxide layer 102, the side wall of the isolation layer 110' exposed due to the divot 112 is also etched thereby expanding the lateral dimension of the divot 112. The divot 112 formed in the trench T causes a problem during subsequent steps of forming a gate electrode. In particular, to form the gate electrode, a thermal oxide film 114 is formed on the semiconductor substrate 100. Next, a polysilicon layer 116 is formed on the entire surface of the semiconductor substrate 100. The divot 112 formed in the trench T is filled with the polysilicon 116, thereby causing a bridge phenomenon between adjacent gate electrodes. Moreover, the operating characteristics of semiconductor devices, for example, threshold voltage, may be degraded due to the polysilicon filling the divot 112.

SUMMARY OF THE INVENTION

To solve the above problems, it is the first object of the present invention to provide a semiconductor device having an isolation layer with an improved structure.

It is the second object of the present invention to provide a method of manufacturing an isolation layer, in which fabrication is simplified and a divot is prevented from being formed in the isolation layer.

Accordingly, to achieve the first object, the present invention provides a semiconductor device having a Y-shaped isolation layer, which comprises side walls characterized by a first and a second slope on the sides of the isolation layer. A nitride liner and a thermal oxide film are preferably interposed between the first and second slopes and the semiconductor substrate.

The first slope is formed in the upper portion of the isolation layer and the second slope is formed in the lower portion of the isolation layer. The side wall with the first slope defines an interface between the upper surfaces of the nitride liner and the thermal oxide film, and the isolation layer, and the side wall with the second slope defines an interface between the side wall of the nitride liner and the isolation layer. The angle between the first slope and the second slope is preferably larger than 90° and smaller than 180°.

To achieve the second object, the present invention provides a method of manufacturing an isolation layer, including the step of forming a trench in a semiconductor substrate. Next, a thermal oxide film is formed on the entire surface of the semiconductor substrate having the trench. Subsequently, a nitride liner is formed on the thermal oxide film. Thereafter, the nitride liner formed at the upper corners of the trench is removed while filling the trench with a gap-filling isolation layer. Next, the entire surface of the semiconductor substrate is planarized using the nitride liner as a planarization stop layer. Thereafter, the nitride liner acting as the planarization stop layer is removed.

The trench may be formed by performing the following process steps. First, a photoresist pattern, which is patterned to have the width of an isolation region, is formed on the semiconductor substrate. Next, the trench is formed in the semiconductor substrate by etching the semiconductor substrate to a predetermined depth using the photoresist pattern as an etching mask. Thereafter, the photoresist pattern is removed.

When removing the nitride liner formed at the upper corner of the trench and filling the trench with a gap-filling isolation layer, it is preferable that the nitride liner at the upper corners of the trench is separated or that the thickness of the nitride liner is reduced.

It is preferable to form the gap-filling isolation layer using a method for depositing a material layer and etching the deposited material layer concurrently in order to filling the trench with the gap-filling isolation layer while removing the nitride liner formed at the upper corner of the trench. For example, the gap-filling isolation layer may be formed by performing high-density plasma chemical vapor deposition (HDP CVD).

The gap-filling isolation layer may be formed by repeatedly and alternately processing the semiconductor substrate in a deposition apparatus and an etching apparatus in order to remove the nitride liner at the upper corners of the trench while forming the gap-filling isolation layer.

The gap-filling isolation layer may be formed using an apparatus which can perform a deposition process and an etching process in situ in order to remove the nitride liner at the upper corners of the trench while forming the gap-filling isolation layer.

The method of the present invention may also include the following steps after removing the nitride liner acting as a planarization stop layer. First, the thermal oxide film, which is exposed after the nitride liner is removed, is removed. Next, a sacrificial oxide film is formed on the semiconductor substrate exposed by removal of the thermal oxide film. Thereafter, ions are implanted in the entire surface of the semiconductor substrate having the sacrificial oxide film. Next, the sacrificial oxide film is removed.

When the gap-filling isolation layer is planarized using the nitride liner as a planarization stop layer, preferably, a chemical mechanical polishing method which uses slurries containing abrasives of the ceria family and/or surfactant having a strong anion property is used. The pH of the slurries is preferably approximately 7.

According to the present invention, formation of a divot at the boundary between an isolation region and an active region can be effectively prevented.

BRIEF DESCRIPTION OF THE DRAWINGS

The above objects and advantages of the present invention will become more apparent by describing in detail preferred embodiments thereof with reference to the attached drawings in which.

DETAILED DESCRIPTION OF THE INVENTION

Figure 1A:
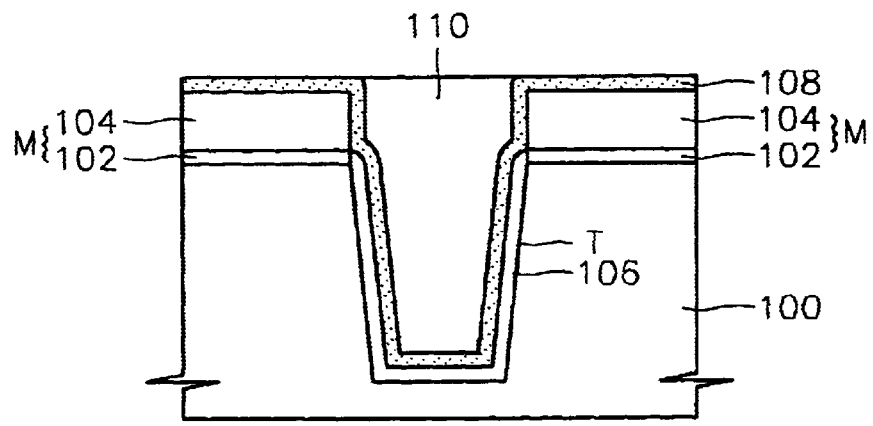
FIGS. 1A through 1C are sectional views for explaining the problems of a conventional trench isolation method.
Figure 1B:
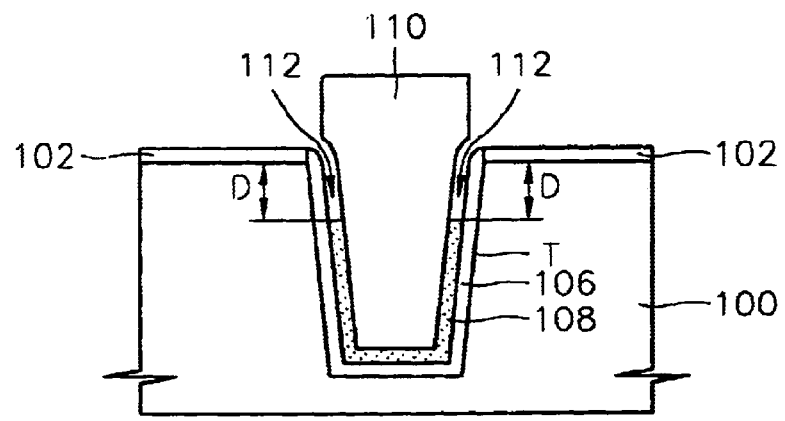
Figure 1C:
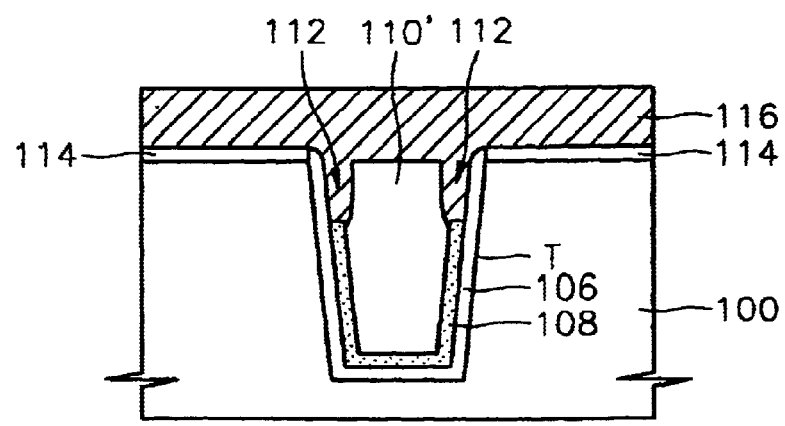

Hereinafter, embodiments of a semiconductor device having a Y-shaped isolation layer and a simplified method of manufacturing the isolation layer to prevent the formation of a divot according to the present invention will be described in detail with reference to the attached drawings. The present invention is not restricted to the following embodiments, and many variations are possible within the spirit and scope of the present invention. The embodiments of the present invention are provided in order to more completely explain the present invention to anyone skilled in the art. In the drawings, the thicknesses of films or regions are exaggerated somewhat for clarity and the same reference numerals denote the same feature. Also, when a film is described as being on another film or a semiconductor substrate, it can be directly on the other film or the semiconductor substrate or an interlayer film can exist therebetween. Various process steps can be added to the process steps, which will be described in the embodiments below, to improve the device characteristics.

Figure 2:
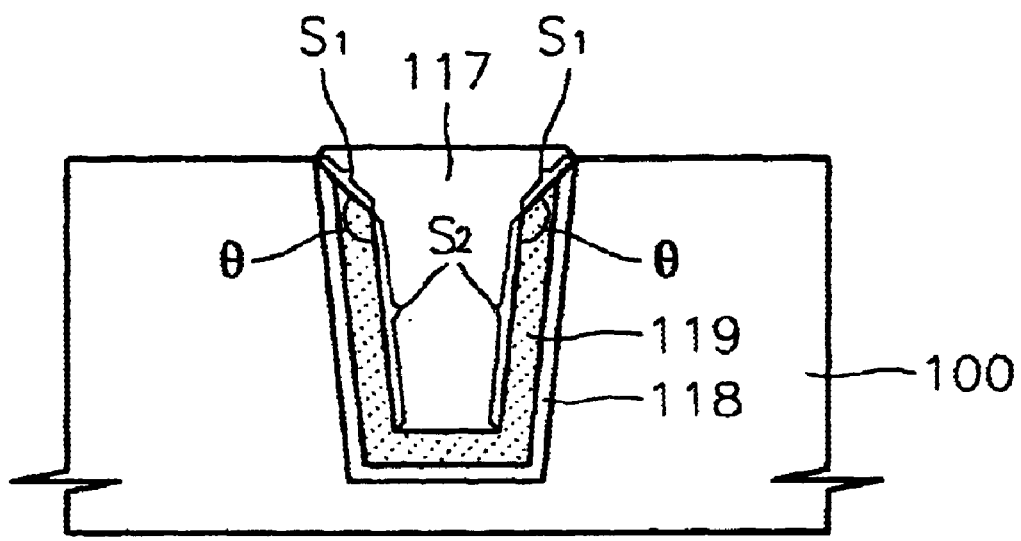
FIG. 2 is a sectional view of an embodiment of a semiconductor device according to the present invention.

Referring to FIG. 2, a semiconductor device according to the present invention includes a Y-shaped isolation layer 117 in a semiconductor substrate 100. Trench sidewalls having a first slope $S_1$ and a second slope $S_2$ are formed on the left and right sides of the isolation layer 117, respectively. A thermal oxide film 118 and a nitride liner 119 are formed between the semiconductor substrate 100 and the isolation layer 117.

The first slope $S_1$ is the slope of the interface between (a) the top surfaces of the thermal oxide film 118 and the nitride liner 119, and (b) the isolation layer 117. The second slope $S_2$ is the slope of the interface between (a) the isolation layer 117 and (b) the sidewall of the nitride liner 119. The thermal oxide film may be a silicon oxide film, and the nitride liner 119 may be a silicon nitride layer or a silicon oxynitride layer. The angle $\theta$ between the first slope $S_1$ and the second slope $S_2$ is preferably larger than approximately 90° and smaller than 180°.

With reference to FIGS. 3 through 15, first and second embodiments of a method for manufacturing an isolation layer according to the present invention will be described in detail.

FIRST EMBODIMENT

Figure 3:
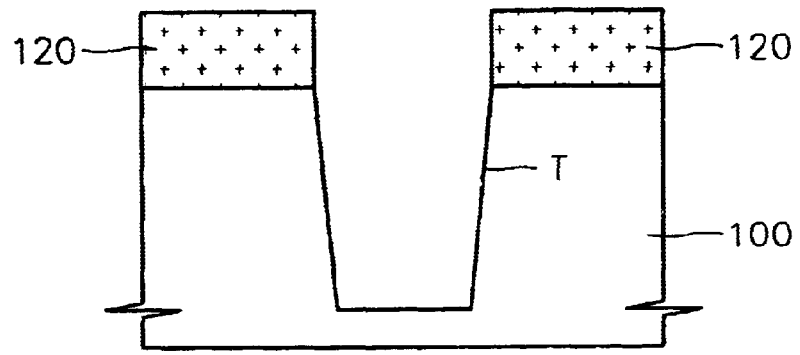
FIGS. 3 through 14 are sectional views for explaining a method of manufacturing an isolation layer according to a first embodiment of the present invention.

Referring to FIG. 3, a photoresist pattern 120 used as an etching mask is formed on a semiconductor substrate 100 by conventional techniques such as a photolithographic process. The photoresist pattern 120 exposes a portion of the semiconductor substrate 100 where an isolation region is to be formed.

Next, the semiconductor substrate 100 is etched using the photoresist pattern 120 as an etching mask to form a trench T in the semiconductor substrate 100. It is preferable to use a dry etch method having a good anisotropic etching characteristic when forming the trench T. For example, dry etch using chloride ($Cl_2$) and hydrogen bromide (HBr) as etching gases may be used. The trench T is formed to a depth sufficiently to electrically isolate semiconductor devices, e.g., transistors formed in active regions. Preferably, the trench T has a depth of approximately 0.25 $\mu$m.

Figure 4:
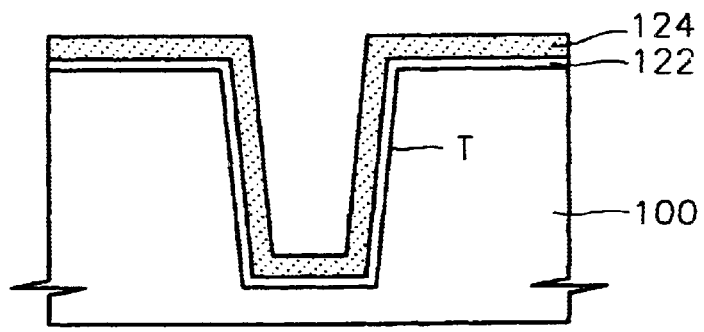

Referring to FIG. 4, the photoresist pattern 120 is removed from the semiconductor substrate 100 by conventional techniques such as an ashing technique using an oxygen plasma. Next, a thermal oxide film 122 is formed on the semiconductor substrate 100 and within the inner wall of the trench T. The thickness of the thermal oxide film 122 may be approximately 30–500 Å.

The thermal oxide film 122 repairs damage to the inner wall of the trench T which occurs when the trench T is formed by dry etch. In other words, the thermal oxide film 122 allows the surface of the semiconductor substrate 100 exposed through the inner wall of the trench to be in a stable bonding state (bonding of Si and $O_2$), thereby reducing leakage currents on the surface of the trench T. In addition, the thermal oxide film 122 slightly rounds the corners at the bottom of the trench T, thereby alleviating concentration of mechanical stress at the bottom corners of the trench T. The thermal oxide film 122 formed on the surface of the semiconductor substrate 100 functions as a pad oxide layer.

After forming the thermal oxide film 122, a thin nitride liner 124 is formed on the thermal oxide film 122. The nitride liner 124 may be formed by a typical method such as a chemical vapor deposition (CVD) method, a sub-atmospheric chemical vapor deposition (SACVD) method, a low pressure chemical vapor deposition (LPCVD) method or a plasma enhanced chemical vapor deposition (PECVD) method. The nitride liner 124 formed in the trench T prevents oxidation of the sidewall of the trench T during a subsequent step of filling the trench T with a gap-filling isolation layer. The nitride liner 124 formed outside of the trench T acts as a planarization stop layer during planarization of the gap-filling isolation layer.

Since the nitride liner 124 has a coefficient of thermal expansion different from that of the gap-filling isolation layer filling the trench T, when the nitride liner 124 is too thick, excessive mechanical stress may occur in the semiconductor substrate 100. Moreover, the time needed to remove the nitride liner 124 acting as a planarization stop layer may increase. As a result, removal of the nitride liner 124 may not be performed uniformly. Accordingly, the nitride liner 124 is preferably formed to a thickness of approximately 40–500 Å.

Figure 5:
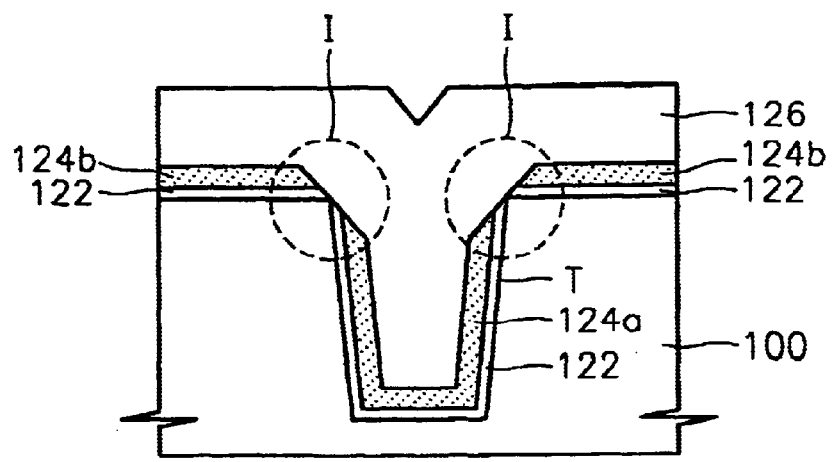

Referring to FIG. 5, the trench T is filled with a gap-filling isolation layer 126 such that the nitride liner 124 is separated into a first nitride liner 124a and a second nitride liner 124b at the upper corners (see I) of the trench T. The gap-filling isolation layer 126 may be formed by conventional techniques, e.g., CVD, SACVD, LPCVD, or PECVD. The gap-filling isolation layer 126 may be a silicon oxide layer, a silicon oxy-nitride layer, a phosphosilicate glass (PSG) layer, a borophosphosilicate glass (BPSG) layer, a tetraethylorthosilicate (TEOS) layer, a plasma enhanced tetraethylorthosilicate (PE-TEOS) layer, an ozone-TEOS layer or an undoped silicate glass (USG) layer.

To separate the nitride liner 124 at the upper corners of the trench T as shown in I, the gap-filling isolation layer 126 may be formed using an apparatus which can perform a deposition process and an etching process simultaneously. Alternatively, the gap-filling isolation layer 126 may be formed using an apparatus that can perform a deposition process and an etching process in situ. Alternatively, the gap-filling isolation layer 126 may be formed by processing the semiconductor substrate 100 in a deposition apparatus and in an etching apparatus repeatedly and alternately.

The gap-filling isolation layer 126 can be formed by performing a high density plasma (HDP) CVD process to separate the nitride liner 124 into the first and second nitride liners 124a and 124b. In the HDP CVD process combining a chemical vapor deposition method and an etching method employing sputtering, both a deposition gas for depositing a material layer and a sputtering gas for etching the deposited material layer by sputtering are supplied into a chamber. For example, when a trench is filled with a silicon oxide layer, silane ($SiH_4$) gas and oxygen ($O_2$) gas are supplied into a chamber as deposition gases, and an inert gas (e.g., argon (Ar) gas) is supplied into the chamber as a sputtering gas.

Some of the supplied deposition gas and sputtering gas is ionized by plasma produced by high-frequency electrical power in the chamber.

Since biased high-frequency electrical power is applied to a wafer chuck (e.g., an electrostatic chuck) on which a semiconductor substrate is mounted in the chamber, the ionized deposition gas and sputtering gas are accelerated toward the surface of the semiconductor substrate. The accelerated deposition gas ions form a silicon oxide layer, and the accelerated sputtering gas ions sputter the deposited silicon oxide layer.

Figure 6:
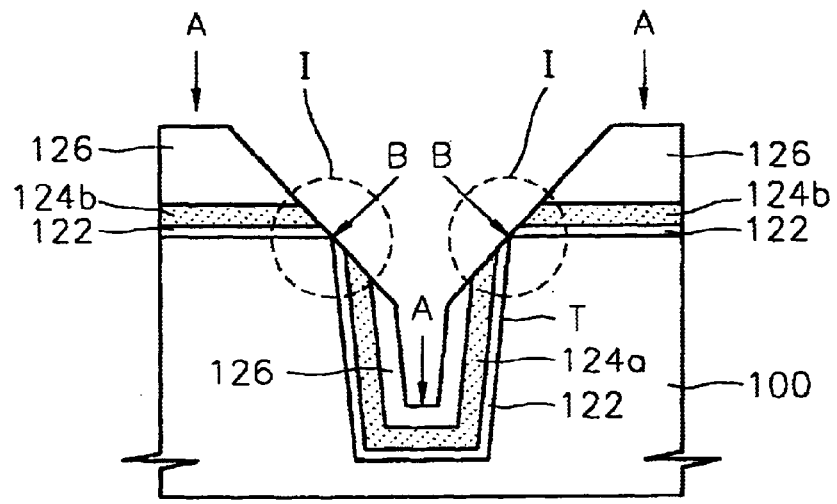

A procedure of separating the nitride liner 124 by applying the HDP CVD process to a method for manufacturing an isolation layer according to the present invention will become more apparent with reference to FIG. 6.

Referring to FIG. 6, when deposition of the gap-filling isolation layer 126 by an HDP CVD process begins, the gap-filling isolation layer 126 is formed on the nitride liner 124 by a deposition gas ionized in plasma within a chamber. As described before, the gap-filling isolation layer 126 is deposited and sputtered simultaneously. The deposition rate of the gap-filling isolation layer 126 is faster than the sputtering rate of the gap-filling isolation layer 126. The rate at which the gap-filling isolation layer 126 is etched by sputtering gas ions (for example, $Ar^+$ ions) is three or four times faster at the upper corners B of the trench T than at the other portion A. Accordingly, in the early stage of the formation of the gap-filling isolation layer 126, the profile of the gap-filling isolation layer 126 deposited in the trench T is a V-shape. As a result, by appropriately controlling the conditions of the HDP CVD process, the nitride liner 124 can be separated into the first nitride liner 124a and the second nitride liner 124b at the upper corners of the trench T as shown in part I in the early stage of the HDP CVD process. In addition, when the trench T is filled with the gap-filling isolation layer 126 by the HDP CVD process, formation of voids in the trench T can be prevented. This is because there is no overhang at the entrance of the trench T (the gap-filling isolation layer 126 is sputtered fastest at the upper corners of the trench T.)

The HDP CVD process can be controlled by a ratio D/S, where D/S=deposition rate of the gap-filling isolation layer 126÷sputtering rate of the deposited gap-filling isolation layer 126. The inventors of the present invention have confirmed that a trench T having an aspect ratio more than 3 can be filled with the gap-filling isolation layer 126 without voids, and that peripheral material layers other than the deposited gap-filling isolation layer 126 can be clipped, when D/S is smaller than about 3. By performing the HDP CVD process while adjusting D/S based on these experimental results, the nitride liner 124 formed at the upper corners of the trench T can be clipped and then separated in the early stage of the HDP CVD process. To separate the nitride liner 124 at the early stage of the HDP CVD process, D/S is preferably approximately 2–5.

To adjust D/S many variables must be controlled. These variables include source power for generating plasma; biased high frequency electrical power applied to a wafer chuck on which a semiconductor substrate is mounted; flow rate of the supplied deposition gas; and flow rate of the sputtering gas. Accordingly, to adjust D/S within the range described above, the conditions of the HDP CVD process are preferably controlled such that source power for generating plasma for the HDP CVD process is approximately 3000–5000 W; bias power applied to a wafer chuck is approximately 800–1000 W; the flow rate of a silicon source gas (e.g., $SiH_4$) is approximately 30–150 sccm; the flow rate of an oxygen source gas (e.g., $O_2$) is approximately 20–400 sccm; and the flow rate of a sputtering gas (e.g., Ar) is approximately 20–400 sccm. When the HDP CVD process is performed until the trench T is completely filled—while adjusting D/S under the conditions described above —the structure shown in FIG. 5 can be obtained.

The following description may be concerns a procedure of separating the nitride liner 124 at the upper corners of the trench T by repeatedly and alternately processing the semiconductor substrate 100 in a deposition apparatus and in an etching apparatus when forming the gap-filling isolation layer 126 to fill the trench T.

Figure 7:
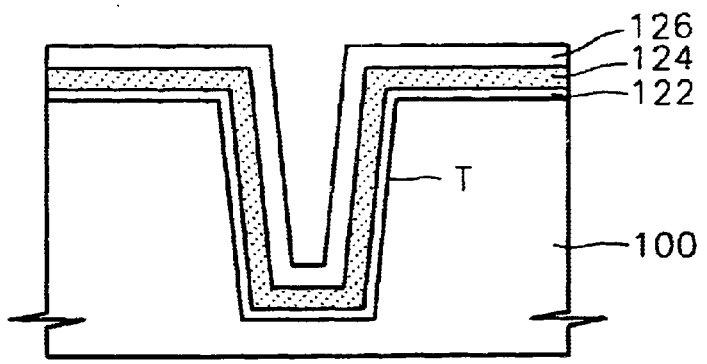

Referring to FIG. 7, the gap-filling isolation layer 126 is formed on the nitride liner 124 to a predetermined thickness, e.g., to a thickness of approximately 200–500 Å, in a deposition apparatus. For deposition, a CVD apparatus, a PECVD apparatus, an LPCVD apparatus or an SACVD apparatus may be used.

Figure 8:
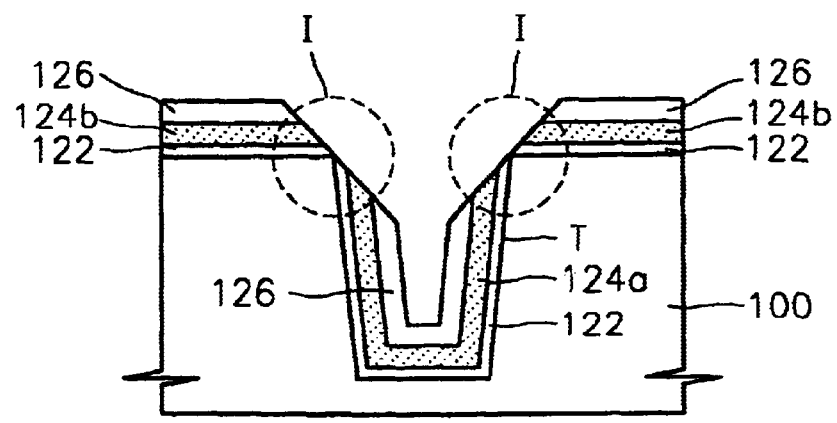

Referring to FIG. 8, the gap-filling isolation layer 126 is etched in an etching apparatus to separate the nitride liner 124 into the first nitride liner 124a and the second nitride layer 124b at the upper corners of the trench T. For the etching apparatus, a reactive ion etching (RIE) apparatus, a magnetic enhanced reactive ion etching (MERIE) apparatus, an ion milling apparatus, or a high pressure plasma etching (HPPE) apparatus may be used.

As described above, the gap-filling isolation layer 126 is etched fastest at the upper corners I of the trench. As a result, the nitride liner 124 is separated into the first nitride liner 124a and the second nitride liner 124b at the upper corners of the trench T as shown in I. After separating the nitride liner 124 into the first nitride liner 124a and the second nitride liner 124b as shown in I, the semiconductor substrate 100 is loaded in the deposition apparatus again to continuously deposit the gap-filling isolation layer 126.

In the above description, the gap-filling isolation layer 126 is formed in the order of deposition-etching-deposition. However, the method of forming the gap-filling isolation layer 126 by repeatedly and alternately processing the semiconductor substrate 100 in a deposition apparatus and in an etching apparatus is not limited to the order of deposition-etching-deposition. The gap-filling isolation layer 126 may be formed in the order of deposition-etching-deposition-etching-deposition. In this case, the separation of the nitride liner 124 as shown in I may be achieved in the first etching step or in the second etching step. When forming the gap-filling isolation layer 126 using both the deposition apparatus and the etching apparatus as describe above, formation of voids in the trench T can also be prevented. The reason was explained while describing the method of forming the gap-filling isolation layer 126 by performing an HDP CVD process.

On the other hand, an apparatus which can perform a deposition process and an etching process in situ may be used to separate the nitride liner 124 while filling the trench T with the gap-filling isolation layer 126. This process is similar to the process of forming the gap-filling isolation layer 126 by repeatedly and alternately processing the semiconductor substrate 100 in a deposition apparatus and in an etching apparatus, described with reference to FIGS. 7 and 8, and thus a description thereof will be omitted. In other words, if a deposition-etching apparatus is used to form the gap-filling isolation layer 126, a deposition process and an etching process are alternately performed in a single apparatus.

Figure 9:
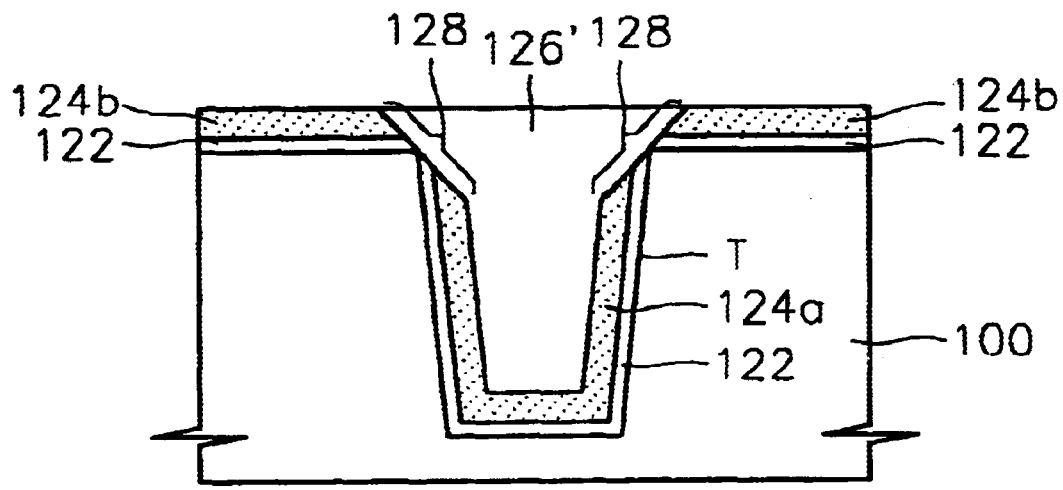

Referring to FIG. 9, after separating the nitride liner 124, the gap-filling isolation layer 126 is planarized to substantially the same level as the top surface of the second nitride liner 124b, thereby forming an isolation layer 126. Preferably, the gap-filling isolation layer 126 may be planarized by conventional techniques such as CMP or etch-back. During the planarization, the second nitride liner 124b is used as a planarization stop layer. When planarizing the gap-filling isolation layer 126 using the CMP, the second nitride liner 124b acts as a CMP stopper. Accordingly, slurries used in the CMP preferably etch the gap-filling isolation layer 126 faster than it does the second nitride liner 124b.

For example, slurries containing abrasives of the silica family or the ceria family may be used. Specifically, when slurries contain abrasives of the ceria family, the slurries preferably contain a surfactant having a strong anion property in addition to the abrasives of the ceria family. The pH of the slurries is preferably set such that the gap-filling isolation layer 126 and the second nitride liner 124b have negative and positive zeta potential values, respectively. When the pH of the slurries is set as described above, the anion surfactant adheres to only the second nitride liner 124b having the positive zeta potential, thereby restraining the reaction between the abrasives of the ceria family and the second nitride liner 124b. In other words, since the surfactant does not adhere to the gap-filling isolation layer 126 having the negative zeta potential, only the gap-filling isolation layer 126 is removed by the abrasives of the ceria family.

According to a test performed by the inventors, it was confirmed that the CMP etch selectivity between the second nitride liner 124b and the gap-filling isolation layer 126 is approximately 1:48 when the pH of slurries is maintained at about 7. Accordingly, when using slurries of the ceria family during the planarization using CMP, the second nitride liner 124b acts as an excellent CMP stop layer. As a result, the process margin is increased in the planarization using CMP, thereby forming an isolation layer 126' of uniform thickness.

According to a test performed by the inventors, it is believed that the etch rate of the gap-filling isolation layer 126 does not change very much even if the pH value of the slurries changes, because slurries of the ceria family are relatively insensitive to changes in pH value. Accordingly, by planarizing the gap-filling isolation layer 126 using slurries containing the ceria family, the process margin for pH can be increased in the planarization using CMP.

Because a negative slope surface 128 is formed at the upper corner of the gap-filling isolation layer 126 filling the trench T, the probability that an isolation region might be smeared with abrasives contained in slurries during CMP of the gap-filling isolation layer 126 is decreased. Consequently, this reduces scratches or infinitesimal damage which are not found as scratches, occurring on the top surface of the semiconductor substrate 100 during the planarization using a CMP method. By reducing the damage such as scratches on the top surface of the semiconductor substrate 100 as described above, the reliability of a gate insulating layer formed in a succeeding process can be improved.

Figure 10:
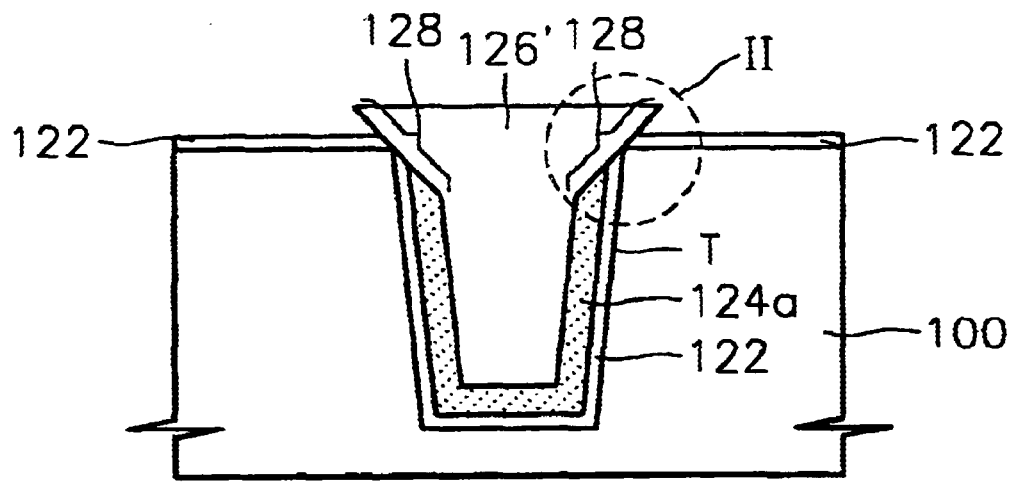

Referring to FIG. 10, the second nitride liner 124b is removed. The second nitride liner 124b may be removed by a wet etch method or a dry etch method using plasma. When removing the second nitride liner 124b using a wet etch method, an etchant containing a phosphoric acid solution is preferably used. For example, if the second nitride liner 124b is formed to a thickness of 100 Å, wet etch is performed for approximately 5 minutes using a phosphoric acid solution of approximately 165° C. to remove the second nitride liner 124b.

The first nitride liner 124a is not etched by an etchant, e.g., a phosphoric acid solution, during the removal of the second nitride liner 124b because the first nitride liner 124a is buried in the trench T when the trench T is filled with the gap-filling isolation layer 126. Accordingly, formation of a divot at the boundary between an isolation region and an active region can be prevented. Consequently, occurrence of a bridge phenomenon between adjacent gate electrodes can be prevented during formation of gate electrodes to be formed later. In addition, process margin is increased in an etching process, for example, a wet etch process, for removing the second nitride liner 124b. This is true even if overetch is performed to completely remove the second nitride liner 124b. Since the first nitride liner 124a is buried in the trench T, even if overetch is performed, the first nitride liner 124a is not etched. For example, if the thickness of the second nitride liner 124b is 100 Å, when the second nitride liner 124b is etched using a phosphoric acid solution of 165° C., even if wet etch is performed for more than 5 minutes, e.g., 30 minutes, formation of divots due to etch of the first nitride liner 124a can be prevented.

Figure 11:
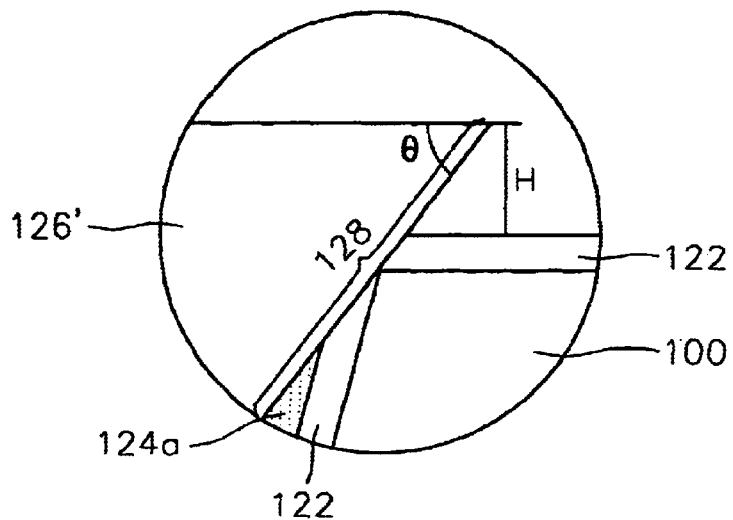

Referring to FIG. 11 which is an enlarged view of the part II of FIG. 10, after the second nitride liner 124b is removed, part of the negative slope surface 128 formed at an upper corner of the isolation layer 126' is exposed. The slope angle θ' between the exposed negative slope surface 128 and the top surface of the isolation layer 126' is approximately 45°. The height H of the exposed negative slope surface 128 corresponds to the thickness of the removed second nitride liner 124. For example, when the thickness of the removed nitride liner 124b is approximately 300 Å, the height of the exposed negative slope surface 128 is also about 300 Å.

The slope angle θ' between the exposed negative slope surface 128 and the top surface of the isolation layer 126' can be increased by isotropic etching. If the isotropic etching is ideally performed, and if the entire surface of the semiconductor substrate 100 is etched by the height H of the exposed negative slope surface 128, then the slope angle θ can be increased to 90°. When the entire surface of the semiconductor substrate 100 is etched by more than the height H of the exposed negative slope surface 128, the slope angle θ can be increased to more than 90°. For example, if the height H of the exposed negative slope surface 128 is 300 Å and the entire surface of the semiconductor substrate 100 is isotropically etched by approximately 300 Å, the slope angle θ' can be increased to 90° and the level of the top surface of the isolation layer 126' can be made substantially equal to the level of the top surface of the semiconductor substrate 100. As a result, the surface topology of the entire surface of the semiconductor substrate 100 is decreased so that process margin for integration process can be increased. Consequently, uniformity of depth of focus can be improved during photolithography for patterning a gate electrode after sequentially forming a gate insulating layer and a conductive layer for the gate electrode.

According to the present invention, an additional process is not required to make the level of the top surface of the isolation layer 126' equal to the level of the top surface of the semiconductor substrate 100 and to increase the slope angle θ'. However, when a thermal oxide film formed on the semiconductor substrate 100 is removed and a sacrificial oxide film for ion-implantation, which is formed during a sacrificial oxidation process, is removed, the entire surface of the semiconductor substrate 100 can be isotropically etched by the height H of the exposed negative slope surface 128 or more. This will be described in detail with reference to FIGS. 12 through 14 that are enlarged views of the upper corner of the isolation layer 126'.

Figure 12:
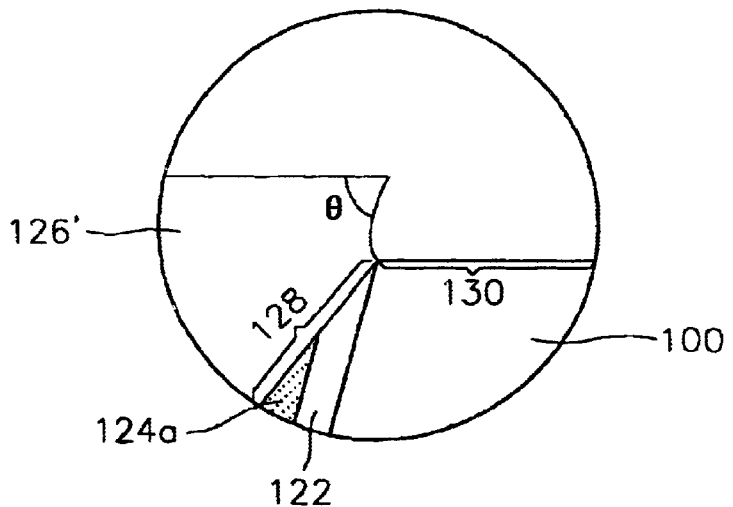

Referring to FIG. 12, the thermal oxide film 122 formed on an active region 130 defined by the isolation layer 126' is removed. The thermal oxide film 122 is preferably removed by a wet etch method having an excellent isotropic etching characteristic. For example, the thermal oxide film 122 may be removed using an HF solution or a buffered oxide etchant (BOE). While the thermal oxide film 122 is removed, the isolation layer 126' is also isotropically etched. As a result, the top surface level of the isolation layer 126' is lowered as much as the top surface level of the active region 130 is lowered during the removal of the thermal oxide film 122. For example, when the top surface level of the active region is lowered by approximately 150 Å during the removal of the thermal oxide film 122, the top surface level of the isolation layer 126' is also lowered by approximately 150 Å. While the isolation layer 126' is being isotropically etched, the slope angle θ' increases as described above.

Figure 13:
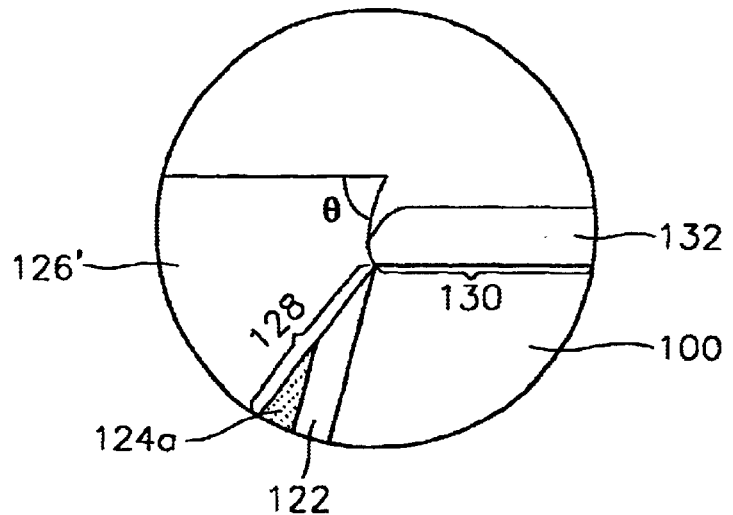

Referring to FIG. 13, a sacrificial oxide film 132 for ion-implantation is formed on the active region 130 defined by the isolation layer 126'. The sacrificial oxide film 132 may be formed by thermal oxidation to a thickness of approximately 20–200 Å. Subsequently, ion-implantation is performed thereon. Ion-implantation is performed for impurity-implantation into the semiconductor substrate 100, formation of a well, formation of a channel stop layer or control of threshold voltages. The sacrificial oxide film 132 repairs damage to the active region 130 of the semiconductor substrate 100, which occurs while the gap-filling isolation layer 126 is planarized by CMP. The sacrificial oxide film 132 also acts as a buffer layer during ion-implantation.

Figure 14:
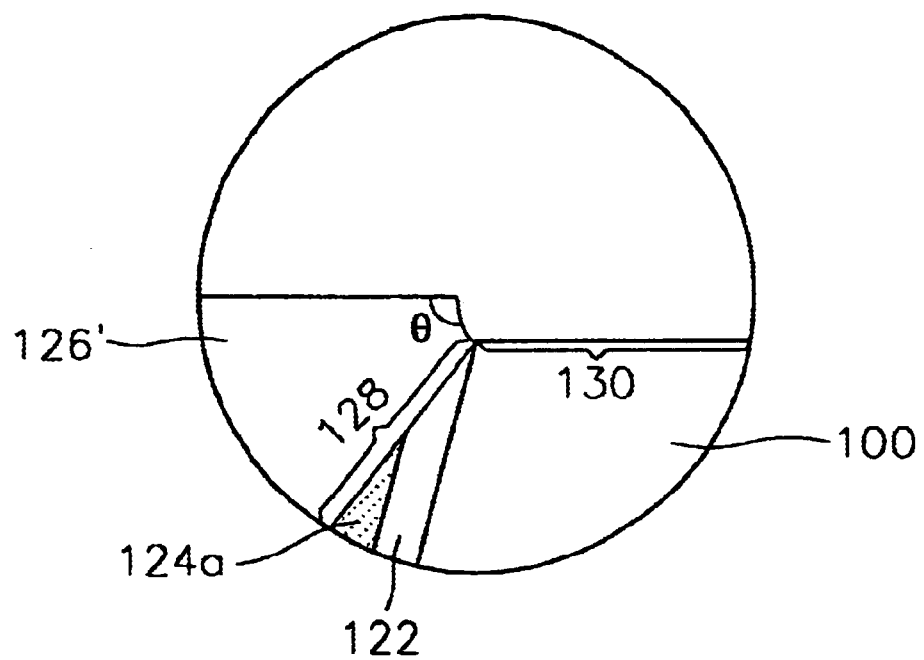

Referring to FIG. 14, the sacrificial oxide film 132 formed on the active region is removed. The sacrificial oxide film 132 is preferably removed by a wet etch method having an excellent isotropic etching characteristic. For example, the sacrificial oxide film 132 may be removed using an HF solution or a BOE. While the sacrificial oxide film 132 is being removed, the isolation layer 126' is also isotropically etched. As a result, the top surface level of the isolation layer 126' is lowered as much as the top surface level of the active region 130 is lowered during the removal of the sacrificial oxide film 132. For example, when the top surface of the active region is lowered by approximately 200 Å during the removal of the sacrificial oxide film 132, the top surface level of the isolation layer 126' is also lowered by approximately 200 Å. As a result, the level of the top surface of the isolation layer 126' is substantially the same as the level of the top surface of the active region 130, and the slope angle θ' is increased. When the height H of the negative slope surface 128 of FIG. 11 is 300 Å, and the top surface level of the isolation layer 126' is lowered by more than 300 Å by isotropic etching during the removal of the thermal oxide film 122 and the sacrificial oxide film 132, the slope angle θ' exceeds 90°. When the top surface level of the isolation layer 126' is lowered by approximately 300 Å, the slope angle θ' is approximately 90°. Even if part of the negative slope surface 128 is exposed and the isolation layer 126' protrudes from the top surface of the semiconductor substrate, the protruding portion of the isolation layer 126' is removed later. Accordingly, even if the entire surface of the semiconductor substrate 100 is not planarized by CMP, the topology of the top surface of the semiconductor substrate 100 can be improved.

As described above, the present invention separates the nitride liner 124 at the upper corners of the trench T while filling the trench T with the gap-filling isolation layer 126. As a result, when the second nitride liner 124b, which is a planarization stop layer, is removed, the negative slope surface 128 protrudes over the top surface of the semiconductor substrate 100, thereby increasing the topology of the entire surface of the semiconductor substrate 100. However, because the thickness of the second nitride liner 124b is less than 500 Å, the height of the exposed part of the negative slope surface 128 is small. Accordingly, even if planarization by CMP is not performed, the topology of the entire surface of the semiconductor substrate 100 can be improved during subsequent process steps.

SECOND EMBODIMENT

A method of manufacturing an isolation layer according to a second embodiment of the present invention proceeds in the same manner as that of the first embodiment except for filling a trench with a gap-filling isolation layer. Thus, only the step of filling a trench with a gap-filling isolation layer will be described in the method of manufacturing an isolation layer according to the second embodiment.

Figure 15:
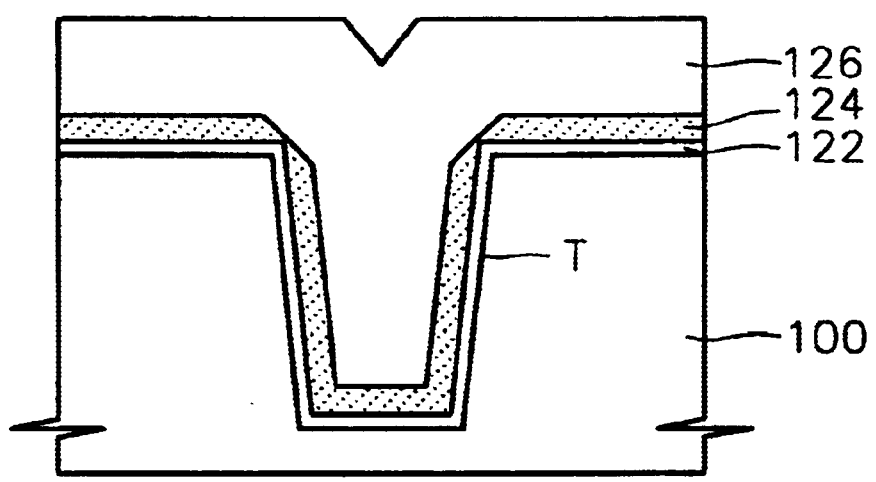
FIG. 15 is a sectional view for explaining a method of manufacturing an isolation layer according to a second embodiment of the present invention.

Referring to FIG. 15, a gap-filling isolation layer 126 for filling a trench T is formed on the entire surface of a semiconductor substrate 100 on which a nitride liner 124 is formed. The gap-filling isolation layer 126 may be formed of the same material layer as that used in the first embodiment, and the gap-filling isolation layer 126 may be formed in the same manner as in the first embodiment. The second embodiment reduces the thickness of the nitride liner 124 at the upper corners of the trench T, instead of separating the nitride liner 124 at the upper corners of the trench T as in the first embodiment, during the formation of the gap-filling isolation layer 126. When the nitride liner 124 is thinner at the upper corners of the trench T, damage to the nitride liner 124 formed in the trench T is alleviated while the nitride liner 124 acting as a planarization stop layer is being removed. This is because the movement of an etchant is less active as the thickness of the nitride liner 124 at the upper corners of the trench T is thinner. Therefore, similar effects can be achieved even if there is some difference, as compared with the first embodiment separating the nitride liner 124.

A method of manufacturing an isolation layer according to the present invention forms a trench using a photoresist pattern as an etching mask to simplify the processes. In addition, a thin nitride liner can be used for two functions. In other words, the nitride liner formed in the trench prevents oxidation of the side wall of the trench, and the nitride liner formed on a semiconductor substrate acts as a planarization stop layer. Since the nitride liner is separated or formed thinly at the upper corners of the trench, formation of divots in the trench can be prevented even when the nitride liner acting as a planarization stop layer is removed. Moreover, even when the nitride liner is removed, since the height of an exposed part of a negative slope surface is small, the exposed negative slope surface can be removed in subsequent process steps without performing a planarization process.

While this invention has been particularly shown and described with references to preferred embodiments thereof, it will be understood by those skilled in the art that various changes in form and details may be made therein without departing from the spirit and scope of the invention as defined by the appended claims.

What is claimed is:
1. A method of manufacturing an isolation layer, the method comprising:
 (a) forming a trench in a semiconductor substrate;
 (b) forming a thermal oxide film on the semiconductor substrate having the trench;
 (c) forming a nitride liner on the thermal oxide film;
 (d) etching a part of the nitride liner formed at the upper corners of the trench and, after completing the etching, depositing a gap-filling isolation layer within the trench to fill the trench with the gap-filling isolation layer;
 (e) planarizing the resulting structure until the nitride liner is exposed; and
 (f) removing the exposed portion of the nitride liner.
2. The method of claim 1, wherein the step (a) comprises:
 forming a photoresist pattern, which is patterned to have the width of an isolation region, on the semiconductor substrate;
 forming the trench in the semiconductor substrate by etching the semiconductor substrate to a predetermined depth using the photoresist pattern as an etching mask; and
 removing the photoresist pattern.
3. The method of claim 1, wherein etching a part of the nitride liner comprises separating the nitride liner at the upper corners of the trench.
4. The method of claim 1, after performing the step (f), further comprising:
 removing the thermal oxide film formed on the semiconductor substrate;
 forming a sacrificial oxide film on the semiconductor substrate exposed by removal of the thermal oxide film;
 implanting ions in the entire surface of the semiconductor substrate having the sacrificial oxide film; and
 removing the sacrificial oxide film.
5. The method of claim 1, wherein the step (e) comprises planarizing the gap-filling isolation layer using a chemical mechanical polishing method which uses slurries containing abrasives of the ceria family.
6. The method of claim 1, wherein the step (e) comprises planarizing the gap-filling isolation layer using a chemical mechanical polishing method which uses slurries containing abrasives of the ceria family and a surfactant having a strong anion property.
7. The method of claim 5, wherein the pH of the slurries is approximately 7.
8. The method of claim 6, wherein the pH of the slurries is approximately 7.
9. The method of claim 1, wherein etching a part of the nitride liner and depositing a gap-filling isolation layer are performed in the same apparatus.
10. The method of claim 1, wherein etching a part of the nitride liner is performed by a reactive ion etching (RIE) apparatus, a magnetic enhanced reactive ion etching (MERIE) apparatus, an ion milling apparatus, or a high pressure plasma etching (HPPE) apparatus.
11. The method of claim 1, wherein depositing a gap-filled isolation layer is performed by a CVD apparatus, a PECVD apparatus, an LPCVD apparatus or an SACVD apparatus.
12. The method of claim 1, further comprising forming the gap-filling isolation layer on the nitride liner, before etching a part of the nitride liner.
13. A method of manufacturing an isolation layer, the method comprising:
 (a) forming a trench in a semiconductor substrate, the trench having side walls with a first slope;

(b) forming a thermal oxide film on the semiconductor substrate having the trench;

(c) forming a nitride liner on the thermal oxide film;

(d) removing the nitride liner formed at the upper corners of the trench in a an etching apparatus and, after completing the removal, filling the trench with a gap-filling isolation layer in a deposition apparatus in such a manner as to form the side walls having the first slope in a lower region thereof and a second slope in an upper region of the side walls;

(e) planarizing the resulting structure until the nitride liner is exposed; and (f) removing the exposed portion of the nitride liner.

14. The method of claim 13, wherein the angle between the first slope and the second slope is larger than approximately 90° and smaller than approximately 180°.

15. The method of claim 1, wherein etching a part of the nitride liner and depositing a gap-filling isolation layer comprises etching the nitride liner in an etching apparatus and depositing a gap-filling isolation layer in a separate deposition apparatus.

16. The method of claim 13, wherein the etching apparatus is a reactive ion etching (RIE) apparatus, a magnetic enhanced reactive ion etching (MERIE) apparatus, an ion milling apparatus, or a high prssure plasma etching (HHP) apparatus.

17. The method of claim 13, wherein the deposition apparatus is a CVD apparatus, a PECVD apparatus, an LPCVD apparatus or an SACVD apparatus.

* * * * *

UNITED STATES PATENT AND TRADEMARK OFFICE
CERTIFICATE OF CORRECTION

PATENT NO. : 6,627,514 B1
DATED : September 30, 2003
INVENTOR(S) : Park et al.

It is certified that error appears in the above-identified patent and that said Letters Patent is hereby corrected as shown below:

Column 9,
Lines 42 and 45, "angle θ can" should read -- angle θ' can --.

Column 12,
Line 58, "a gap-filled isolation" should read -- a gap-filling isolation --.

Column 13,
Line 5, "trench in a an etching" should read -- trench in an etching --.

Column 14,
Line 10, "high prssure plasma etching (HHP) apparatus" should read -- high pressure plasma etching (HPPE) apparatus --.

Signed and Sealed this

Twenty-second Day of June, 2004

JON W. DUDAS
*Acting Director of the United States Patent and Trademark Office*